United States Patent
Lei et al.

(10) Patent No.: US 9,209,084 B2
(45) Date of Patent: Dec. 8, 2015

(54) MASKLESS HYBRID LASER SCRIBING AND PLASMA ETCHING WAFER DICING PROCESS

(71) Applicants: Wei-Sheng Lei, San Jose, CA (US);
Brad Eaton, Menlo Park, CA (US);
James S. Papanu, San Rafael, CA (US);
Ajay Kumar, Cupertino, CA (US)

(72) Inventors: Wei-Sheng Lei, San Jose, CA (US);
Brad Eaton, Menlo Park, CA (US);
James S. Papanu, San Rafael, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/454,656

(22) Filed: Aug. 7, 2014

(65) Prior Publication Data

US 2015/0111364 A1    Apr. 23, 2015

Related U.S. Application Data

(63) Continuation of application No. 14/060,005, filed on Oct. 22, 2013.

(51) Int. Cl.
*H01L 21/00* (2006.01)
*H01L 21/78* (2006.01)
(Continued)

(52) U.S. Cl.
CPC ............ *H01L 21/78* (2013.01); *B23K 26/0042* (2013.01); *B23K 26/0057* (2013.01); *B23K 26/0635* (2013.01); *H01L 21/3065* (2013.01); *H01L 21/82* (2013.01); *B23K 2201/40* (2013.01)

(58) Field of Classification Search
CPC .............. H01L 21/563; H01L 21/4853; H01L 21/6836; H01L 24/10; H01L 24/14; H01L 24/28; H01L 23/49816; H01L 2224/73203; H01L 2224/73104; H01L 2224/73103; H01L 2224/81191; H01L 2924/14; H01L 2225/1058
USPC ............. 438/33, 42, 107, 108, 110, 113, 114, 438/127, 462, 465, 460, 612, 613; 257/723, 257/737, 738, 778, 782, 783, 787, 789, 790, 257/795
See application file for complete search history.

(56) References Cited

U.S. PATENT DOCUMENTS 4,049,944 A    9/1977 Garvin et al.
4,339,528 A    7/1982 Goldman
(Continued)

FOREIGN PATENT DOCUMENTS

JP    9216085    8/1997
JP    10321908    12/1998
(Continued)

OTHER PUBLICATIONS

Linder, V. et al., "Water-Soluble Sacrificial Layers for Surface Micromachining", www.small-journal.com, 2005, 1, No. 7, 7 pgs.
(Continued)

*Primary Examiner* — Thanh Y Tran
(74) *Attorney, Agent, or Firm* — Blakely Sokoloff Taylor Zafman LLP

(57) ABSTRACT

Maskless hybrid laser scribing and plasma etching wafer dicing processes are described. In an example, a method of dicing a semiconductor wafer having a front surface with a plurality of integrated circuits thereon and having a passivation layer disposed between and covering metal pillar/solder bump pairs of the integrated circuits involves laser scribing, without the use of a mask layer, the passivation layer to provide scribe lines exposing the semiconductor wafer. The method also involves plasma etching the semiconductor wafer through the scribe lines to singulate the integrated circuits, wherein the passivation layer protects the integrated circuits during at least a portion of the plasma etching. The method also involves thinning the passivation layer to partially expose the metal pillar/solder bump pairs of the integrated circuits.

6 Claims, 12 Drawing Sheets

(51) Int. Cl.
  *H01L 21/3065* (2006.01)
  *H01L 21/82* (2006.01)
  *B23K 26/00* (2014.01)
  *B23K 26/06* (2014.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,002,292 B2 | 2/2006 | Prakash | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,441,271 B2 | 5/2013 | Kitazume et al. | |
| 2003/0162313 A1 | 8/2003 | Kim et al. | |
| 2004/0080045 A1 | 4/2004 | Kimura et al. | |
| 2004/0087054 A1 | 5/2004 | Chinn et al. | |
| 2004/0113283 A1* | 6/2004 | Farnworth et al. | 257/782 |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2005/0266680 A1* | 12/2005 | Daskal et al. | 438/637 |
| 2006/0024924 A1 | 2/2006 | Haji et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2009/0255911 A1 | 10/2009 | Krishnaswami et al. | |
| 2010/0013036 A1 | 1/2010 | Carey | |
| 2010/0102828 A1 | 4/2010 | Bromberg et al. | |
| 2010/0102838 A1 | 4/2010 | Kitazume et al. | |
| 2010/0216313 A1 | 8/2010 | Iwai | |
| 2010/0248451 A1 | 9/2010 | Pirogovsky et al. | |
| 2011/0014777 A1 | 1/2011 | Haji et al. | |
| 2011/0312157 A1* | 12/2011 | Lei et al. | 438/462 |
| 2012/0322237 A1 | 12/2012 | Lei et al. | |
| 2013/0045554 A1 | 2/2013 | Yamazaki | |
| 2013/0045570 A1 | 2/2013 | Schuegraf et al. | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Non-Final Office Action from U.S. Appl. No. 14/060,005 mailed Sep. 30, 2014, 8 pgs.

* cited by examiner $$I = \frac{E_p}{\pi \cdot w_0^2 \cdot \tau}$$

Intensity — $I$
Pulse Energy — $E_p$
Beam Radius — $w_0$
Pulse Width — $\tau$

MASKLESS HYBRID LASER SCRIBING AND PLASMA ETCHING WAFER DICING PROCESS

CROSS-REFERENCE TO RELATED APPLICATIONS

This application is a continuation of U.S. patent application Ser. No. 14/060,005, filed on Oct. 22, 2013, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

BRIEF DESCRIPTION OF THE DRAWINGS

One or more embodiments described herein are directed to maskless hybrid laser scribing and plasma etching wafer dicing processes.

In an embodiment, a method of dicing a semiconductor wafer having a front surface with a plurality of integrated circuits thereon and having a passivation layer disposed between and covering metal pillar/solder bump pairs of the integrated circuits involves laser scribing, without the use of a mask layer, the passivation layer to provide scribe lines exposing the semiconductor wafer. The method also involves plasma etching the semiconductor wafer through the scribe lines to singulate the integrated circuits, wherein the passivation layer protects the integrated circuits during at least a portion of the plasma etching. The method also involves thinning the passivation layer to partially expose the metal pillar/solder bump pairs of the integrated circuits.

In another embodiment, a system for dicing a semiconductor wafer includes a factory interface. A laser scribe apparatus is coupled with the factory interface. A plasma etch chamber is coupled with the factory interface. A plasma ash chamber is coupled with the factory interface.

In another embodiment, a method of dicing a silicon wafer including a front surface having a plurality of DRAM circuits thereon and having a polyimide layer disposed between and covering metal pillar/solder bump pairs of the DRAM circuits involves laser scribing, without the use of a mask layer, the polyimide layer to provide scribe lines exposing the silicon wafer. The laser scribing is performed through a layer of low K material and a layer of copper both disposed between the polyimide layer and the silicon substrate. The laser scribing involves a femto-second-based laser scribing process. The method also involves plasma etching the silicon wafer through the scribe lines to singulate the DRAM circuits, wherein the polyimide layer protects the DRAM circuits during at least a portion of the plasma etching. The method also involves plasma ashing the polyimide layer to thin the polyimide layer, partially exposing the metal pillar/solder bump pairs of the DRAM circuits.

BRIEF DESCRIPTION OF THE DRAWINGS

Figure 1A:
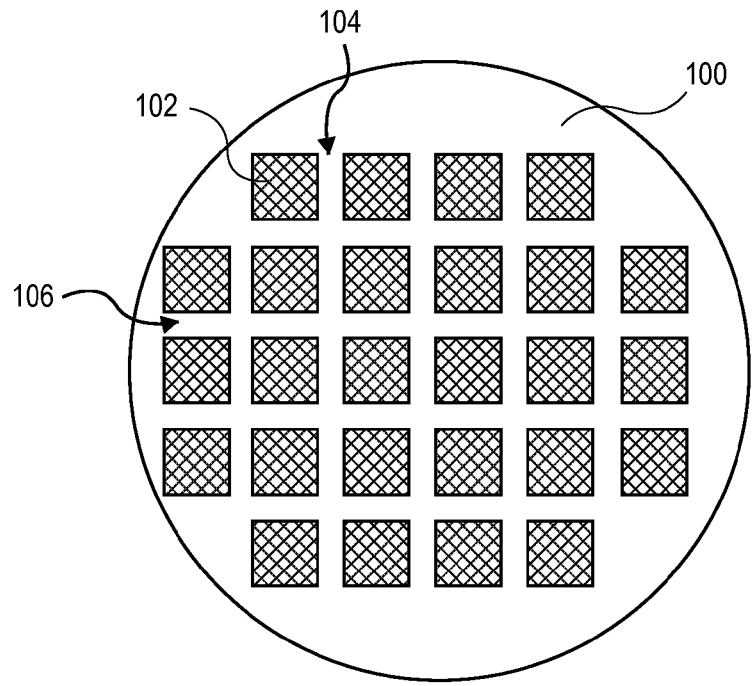

FIG. 1A illustrates a top plan of a conventional semiconductor wafer to be diced.

Figure 1B:
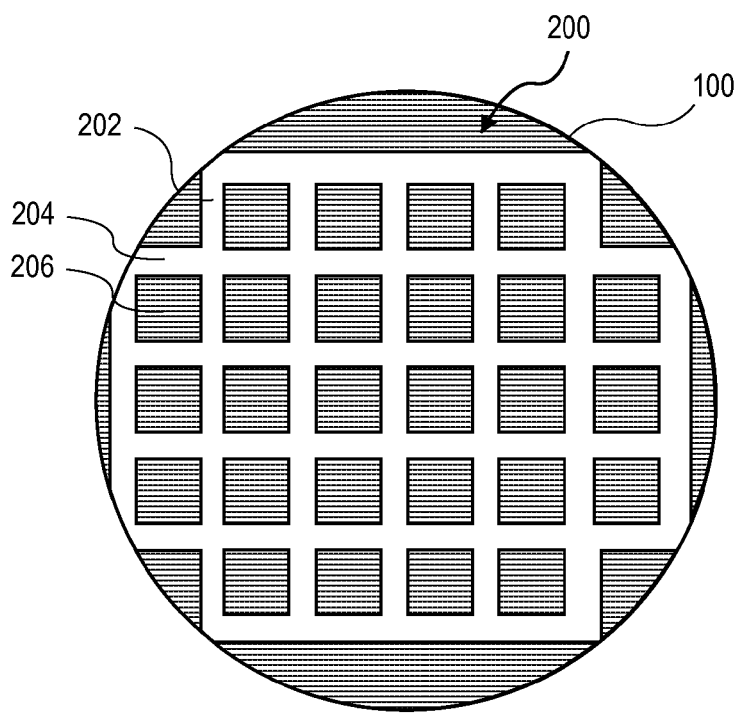

FIG. 1B illustrates a top plan of a semiconductor wafer having a thick passivation layer following a laser scribing process but prior to a plasma etching process, in accordance with an embodiment of the present invention.

Figure 2A:
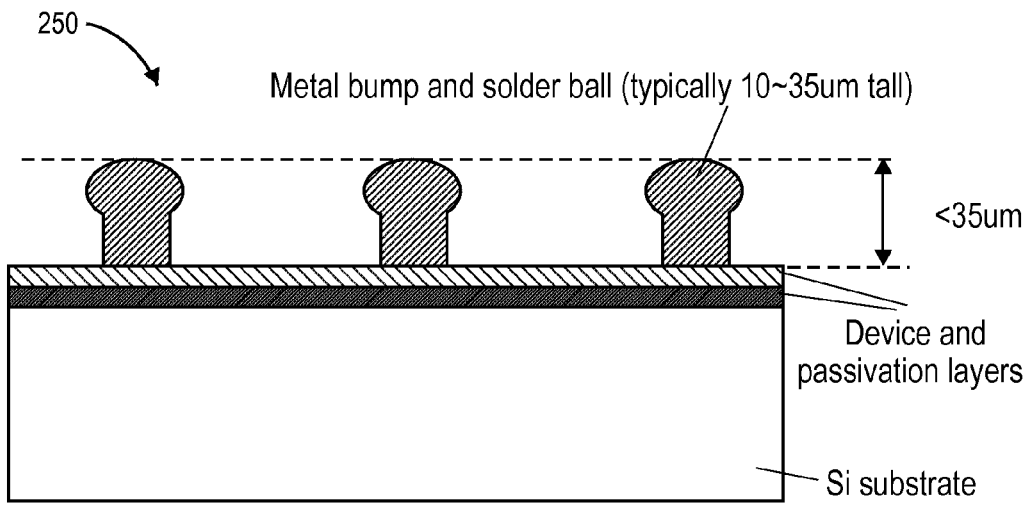

FIG. 2A illustrates a cross-sectional view of a portion of a state-of-the-art DRAM wafer.

Figure 2B:
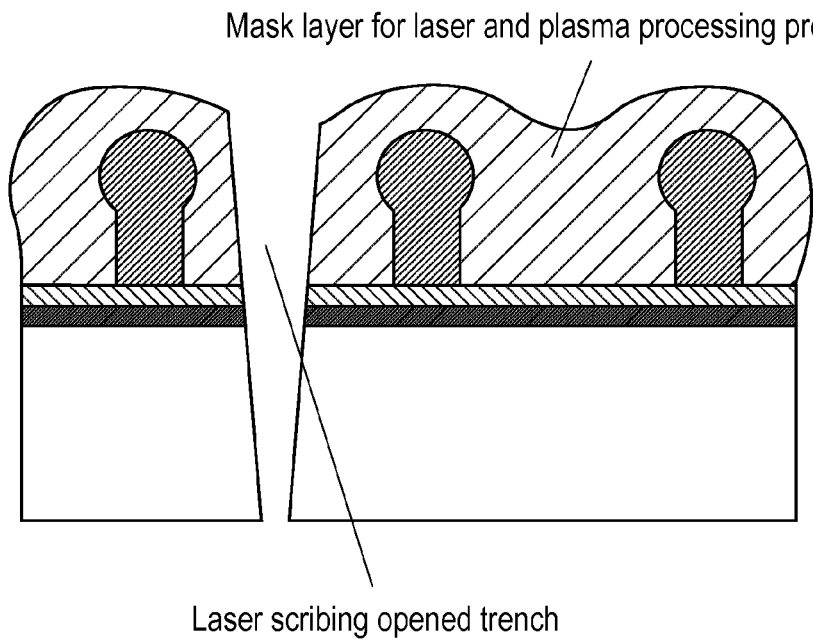

FIG. 2B illustrates a cross-sectional view representing an operation in a dicing process for a portion of the state-of-the-art DRAM wafer of FIG. 2A.

FIG. 3A-3E illustrate cross-sectional view of a semiconductor wafer including a plurality of integrated circuits during performing of a method of dicing the semiconductor wafer, in accordance with an embodiment of the present invention.

Figure 4:
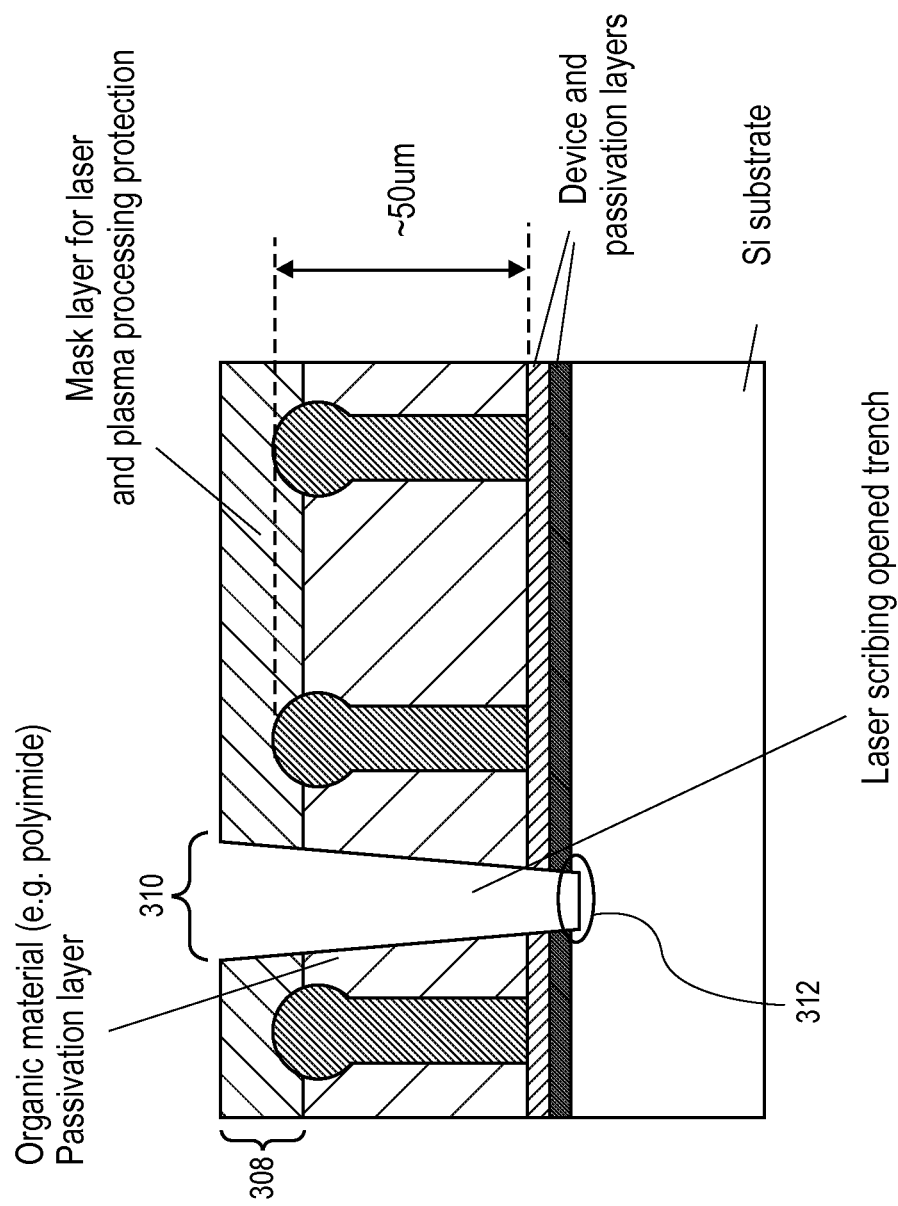

FIG. 4 illustrates a cross-sectional view of a semiconductor wafer including a plurality of integrated circuits during performing of a comparative method of dicing the semiconductor wafer.

Figure 5:
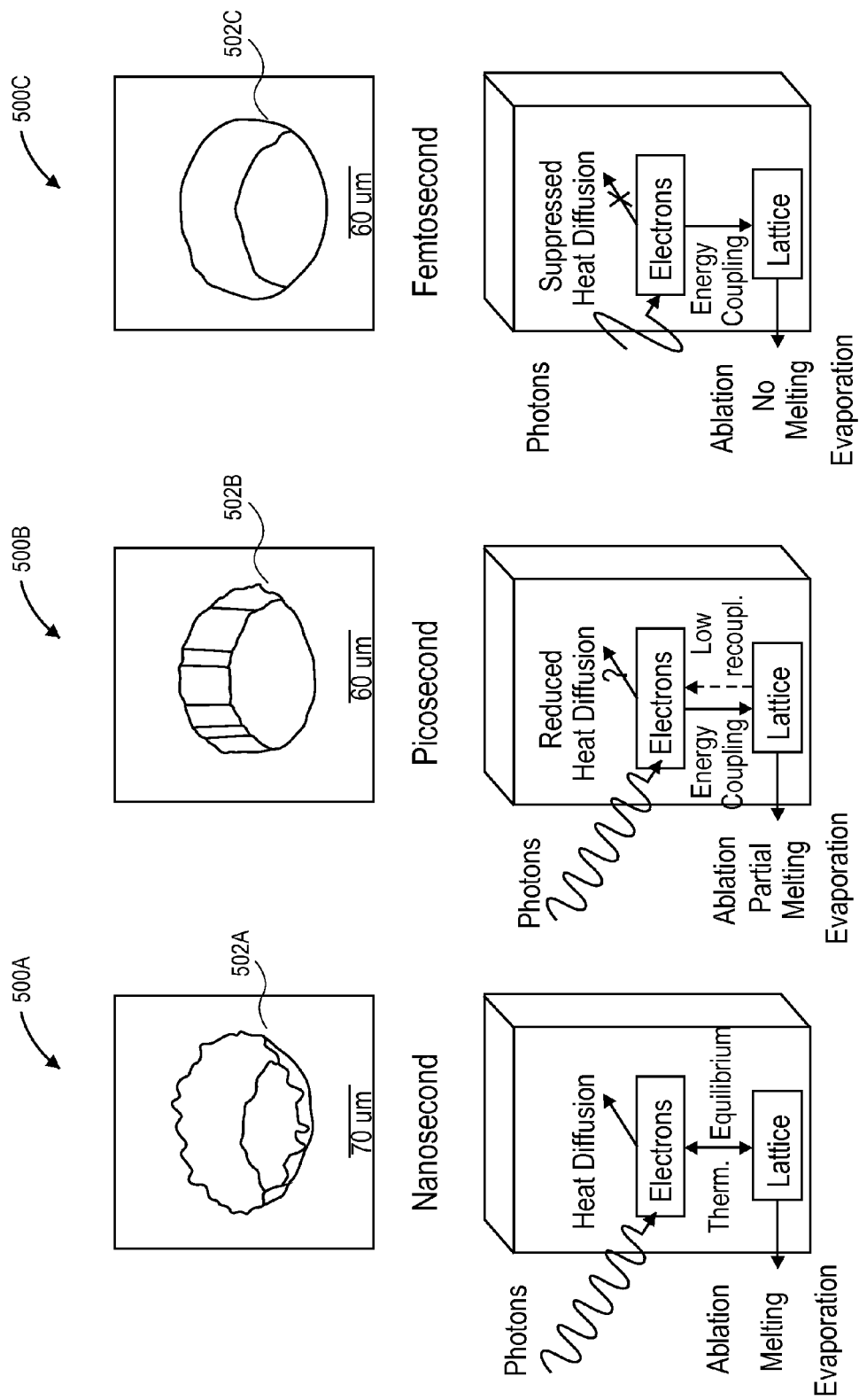

FIG. 5 illustrates the effects of using a laser pulse in the femtosecond range versus longer pulse times, in accordance with an embodiment of the present invention.

Figure 6:
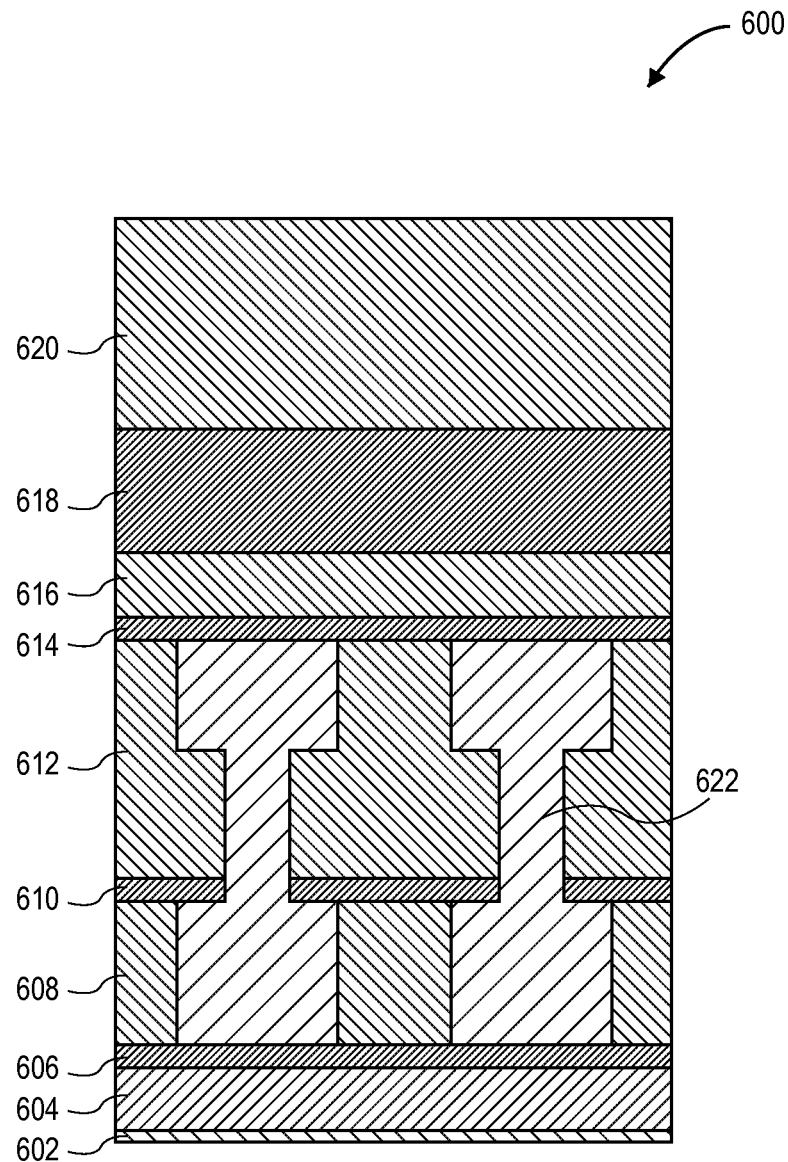

FIG. 6 illustrates a cross-sectional view of a stack of materials that may be used in a street region of a semiconductor wafer or substrate, in accordance with an embodiment of the present invention.

Figures 7, 8:
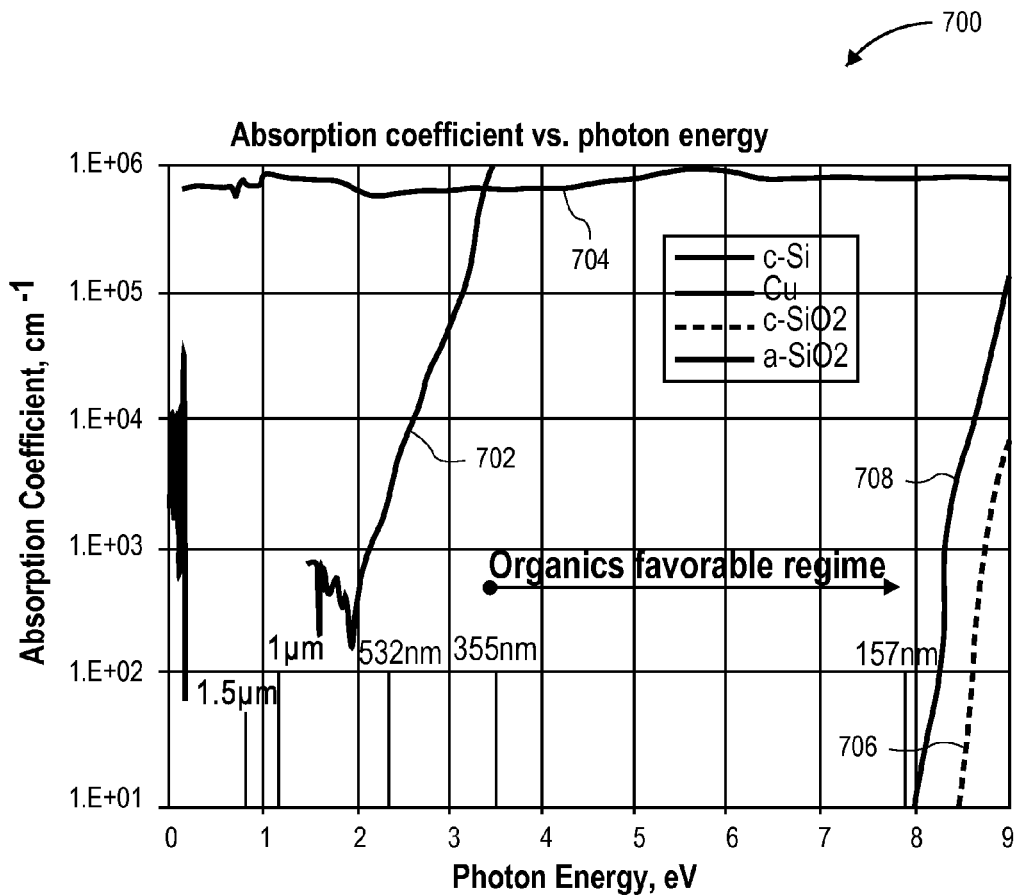

FIG. 7 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.

FIG. 8 is an equation showing the relationship of laser intensity for a given laser as a function of laser pulse energy, laser pulse width, and laser beam radius.

Figure 9:
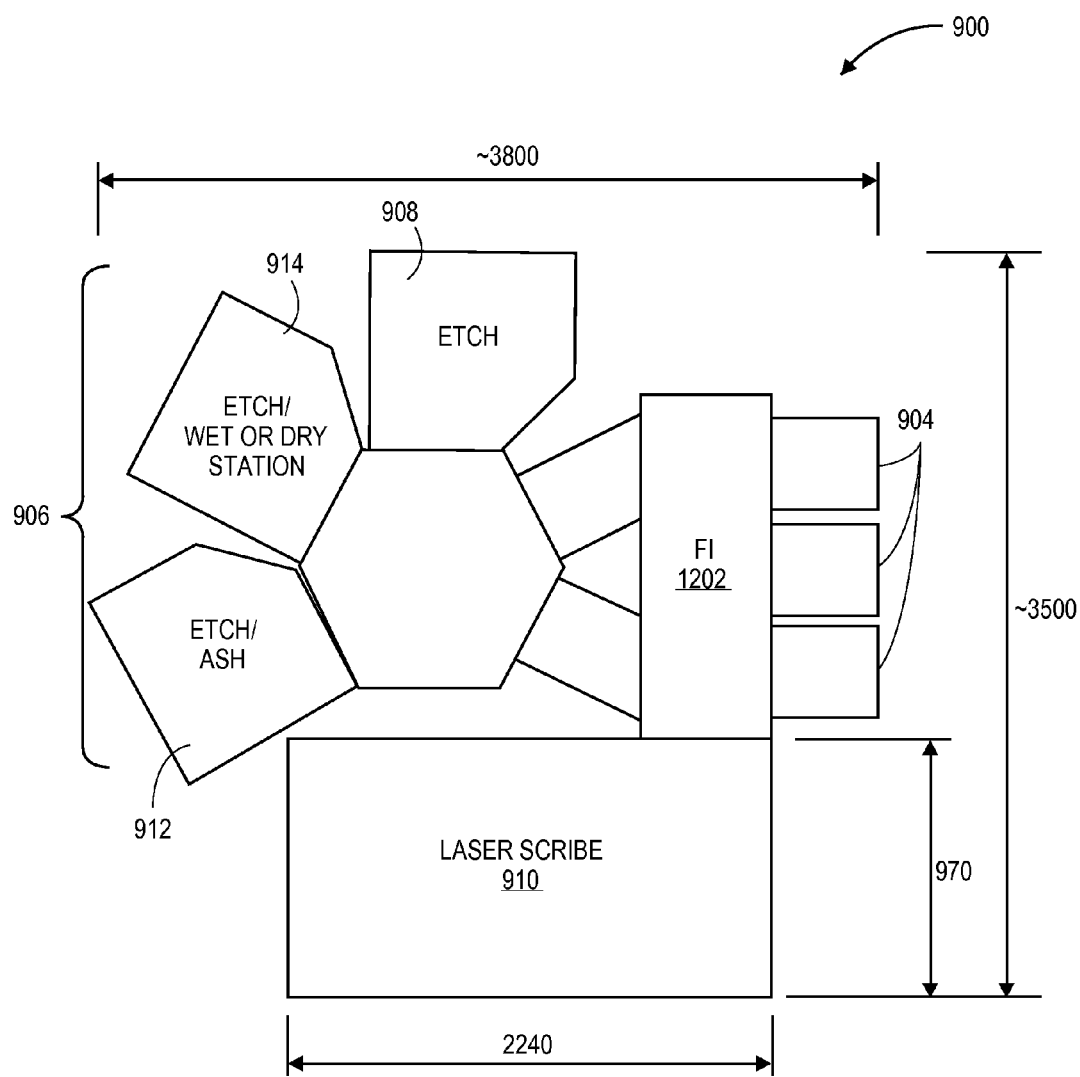

FIG. 9 illustrates a block diagram of a tool layout for laser and plasma dicing of wafers or substrates, in accordance with an embodiment of the present invention.

Figure 10:
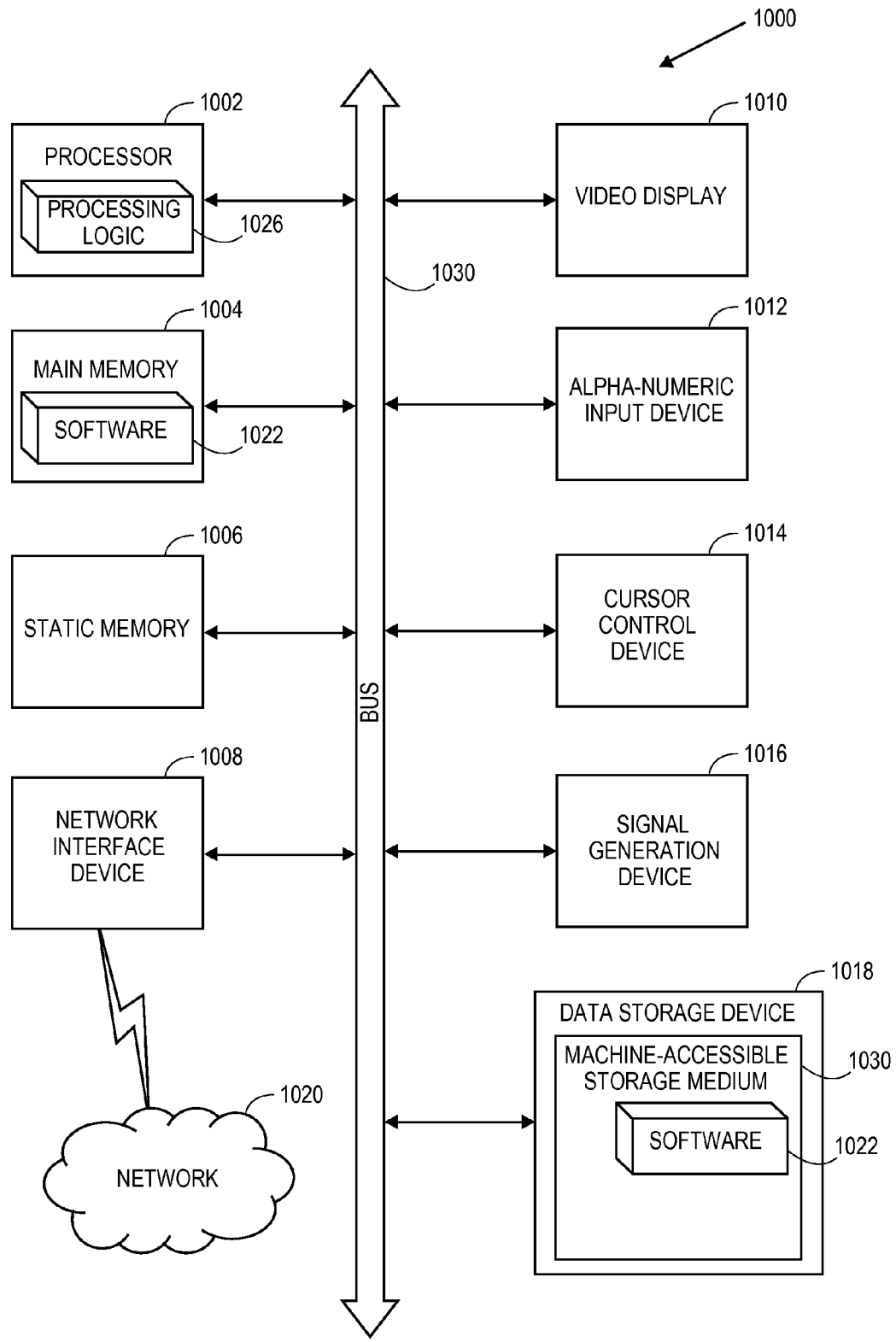

FIG. 10 illustrates a block diagram of an exemplary computer system, in accordance with an embodiment of the present invention.

DETAILED DESCRIPTION

Maskless hybrid laser scribing and plasma etching wafer dicing processes are described. In the following description, numerous specific details are set forth, such as laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a thick passivation layer, organic and/or inorganic dielectric layers, and device layers. The laser etch process may then be terminated upon exposure of, or partial etch of, the underlying wafer or substrate. The plasma etch portion of the dicing process may then be employed to etch through the bulk of the wafer or substrate, such as through bulk single crystalline silicon, to yield die or chip singulation or dicing. In particular embodiments herein, a method to dice wafers with a thick passivation polymer layer are described. In an embodiment, the laser scribing performed is a maskless process in the sense that a thick passivation layer is used as included on the integrated circuits, without the use of an additional overlying mask during scribing and plasma etching.

More generally, embodiments described herein are directed to femtosecond-based laser scribing and subsequent plasma etching to provide a hybrid wafer dicing approach. Regarding wafer dicing technologies in general, most existing dicing technologies involve the use of wet processes at some stage of the dicing process. For example, in hybrid laser scribing and plasma etching approaches, a mask coating formation process is often employed to protect wafers during laser and plasma processes. However, challenges exist with respect to obtaining defect-free mask coating and post-dicing mask removal and cleaning. Furthermore, existing semiconductor grade commercial tools for spin coating are expensive. In another aspect, laser dicing processes can demand mask coating and subsequent post dicing mask removal and, in yet another aspect, blade dicing can demand continuous cooling water/lubricant during dicing processes. Regarding integrated circuit (IC) technologies, new/next generation memory chips for three-dimensional (3D) packaging can bear an approximately 40 microns thick polymer film atop device layers as a passivation layer. By comparison, current microprocessor device wafers have been using top layer polymer passivation, where (a) dry film lamination technology has been used to apply the polymer film layer onto wafers and/or (b) the polymeric passivation layer has a target thickness wherein dry film lamination process can control the laminating thickness.

As such, more specifically, one or more embodiments are directed to approaches involving the use of a polymer film on top of a wafer front side to form a layer that is thicker than the targeted passivation layer of the resulting IC. For example, in the same process of dry film lamination for polymeric passivation layer formation, a thicker passivation layer is formed than is ultimately desired on the resulting singulated IC. The additional thickness of the polymer or passivation layer is, in one embodiment, sufficient to cover all underlying IC bumps such that, during laser scribing, the ejected debris falls on top of the polymer or passivation layer and does not damage the solder bumps. Furthermore, the additional thickness is sufficient to protect IC devices including solder bumps from being exposed during plasma dicing. After the plasma etching is performed to dice through wafers, remaining polymer layer above the targeted passivation layer thickness is removed by a plasma ashing process using oxygen or oxygen-containing gases, until the target passivation layer thickness is achieved. In one such embodiment, the ashing process is also suitable for removing chemical residues that may have been formed on bump tops as well on the side wall of singulated dies during the plasma etching process.

In an embodiments, benefits of a maskless dicing scheme as described herein include one or more of (1) no additional mask coating operation is needed, (2) the opportunity to take advantage of dry passivation film lamination processes, i.e., during the lamination, a thicker initial passivation layer may be formed, which is thicker than the target final thickness, (3) removal of issues associated with thick mask spin coating, and (4) a dry mask process flow is expected to include dedicated deposition chamber integrated on a dicing system.

To provide a general comparison, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, a femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Thus, in an aspect of the present invention, a combination of laser scribing and plasma etching may be used to dice a semiconductor wafer into singulated integrated circuits. However, certain embodiments are directed to a maskless process, wherein a passivation layer of the IC is used to protect bumps of the IC during the dicing process. To provide further context, FIG. 1A illustrates a top plan of a conventional semiconductor wafer to be diced. FIG. 1B illustrates a top plan of a semiconductor wafer having a thick passivation layer following a laser scribing process but prior to a plasma etching process, in accordance with an embodiment of the present invention.

Referring to FIG. 1A, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination femtosecond-based laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 1B, in accordance with an embodiment directed to a maskless approach, the semiconductor wafer 100 has a thick passivation layer 200. The thick passivation layer 200 and a portion of the semiconductor wafer 100 are patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the thick passivation layer 200. The regions 206 of the thick passivation layer 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. As described below, the passivation layer 200 may subsequently be thinned to expose portions of metal bumps/pillars of the integrated circuits.

More particular embodiments are directed to singulation consideration for a new generation of DRAM memory chips that bear 50 micron or higher bumps for interconnects and having a thick polyimide layer surrounding the bumps. The thick polyimide layer is included to provide mechanical support, electrical isolation and passivation, with only the bump top surface exposed for soldering. However, such a thick passivation layer must be accounted for in a dicing scheme. In an embodiment, a wafer is first provided with a passivation layer having an initial thickness above, and covering, the bumps and then scribed with a laser to remove all the layers above the Si substrate. The laser scribing is followed by plasma dicing to remove exposed portions of the Si substrate. The thick polyimide passivation layer is then thinned by ashing to a final thickness approximately in the range of 35-50 microns to provide access to the metal bumps.

To provide thorough context, FIG. 2A illustrates a cross-sectional view of a portion of a state-of-the-art DRAM wafer. Referring to FIG. 2A, wafer 250 has thereon DRAM memory chips having metal bumps and solder balls that are typically 10-35 um tall. The DRAM memory chips also include device and passivation layers, all disposed on a Si substrate. FIG. 2B illustrates a cross-sectional view representing an operation in a dicing process for a portion of the state-of-the-art DRAM wafer of FIG. 2A. Referring to FIG. 2B, a mask layer is disposed above the structure of FIG. 2A. Laser scribing is performed to provide a trench between the bump/solder balls to provide an opened trench. Plasma etching may then be performed through the trench for wafer dicing.

By contrast to FIGS. 2A and 2B, FIGS. 3A-3E illustrate cross-sectional views of a portion of a new DRAM wafer 350 including a plurality of DRAM chips (integrated circuits) during performing of a method of dicing the semiconductor wafer, in accordance with an embodiment of the present invention.

Figure 3A:
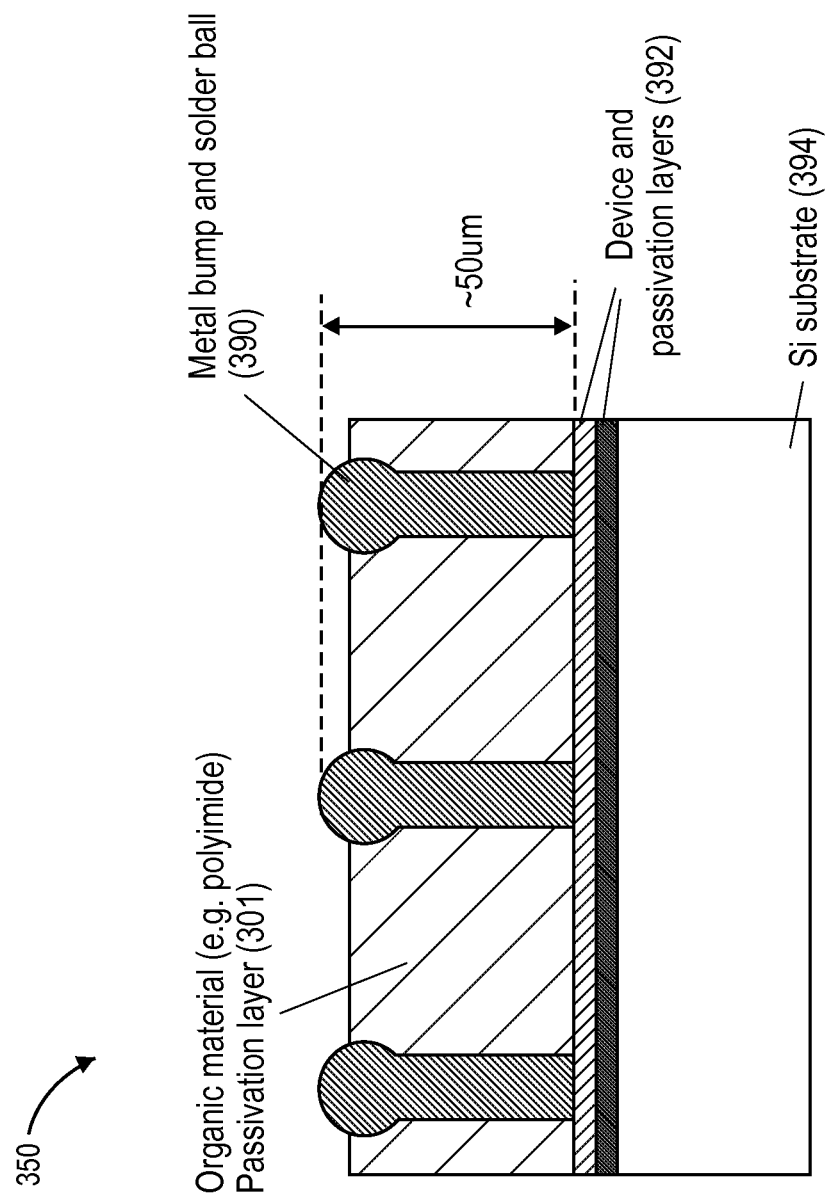

Referring to FIG. 3A, wafer 350 has thereon DRAM memory chips having metal bump/solder ball pairs 390 that are approximately 50 microns or taller. An approximately 35-50 micron organic layer, such as a polyimide layer, is used as a passivation layer 301 between the metal bump/solder ball pairs, exposing only the uppermost portion of these pairs. The passivation layer 301 may be a necessary structural component of the DRAM dies. The DRAM memory chips also include device and passivation layers 392, all of which are disposed on a substrate 394, such as a silicon (Si) substrate.

Figure 3B:
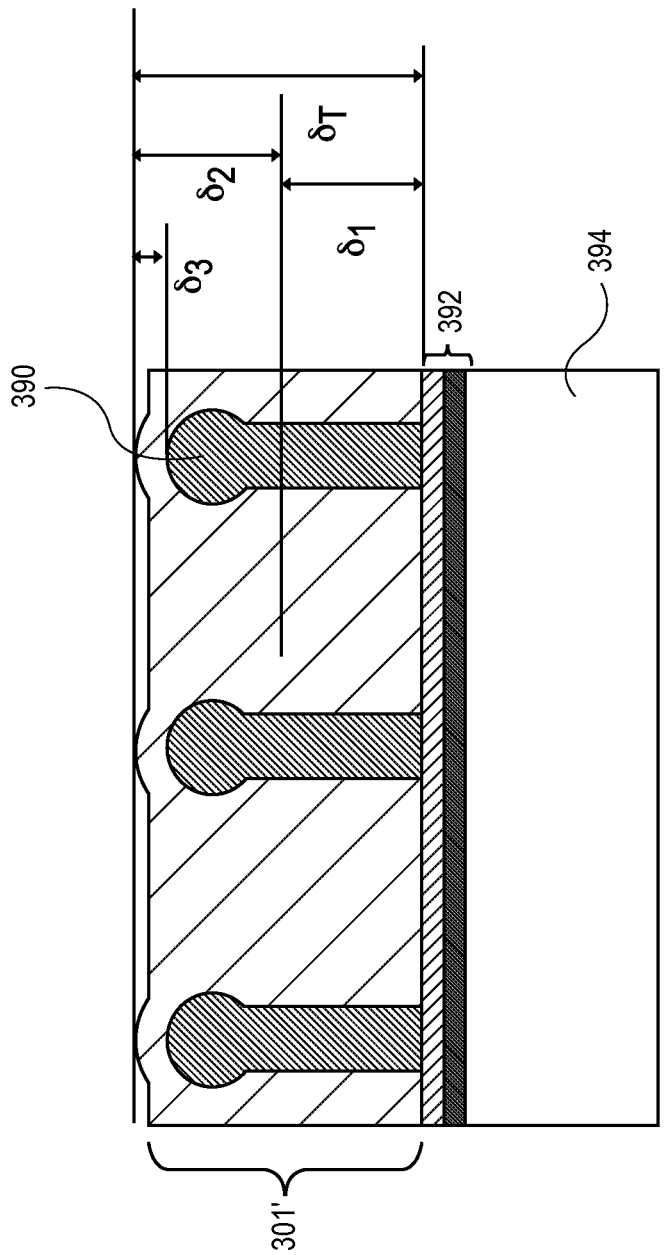

Referring to FIG. 3B, the passivation layer 301 of FIG. 3A is shown as a thicker passivation layer 301' covering and protecting the exposed bump/solder ball pairs 390. Although, in accordance with one embodiment, the thickening of passivation layer 301 to 301' is shown as being step-wise from FIG. 3A to 3B, i.e., additional passivation layer (such as additional polyimide) is added to an already formed film. However, in another embodiment, the initial thickness of the passivation layer is as shown in FIG. 3B, i.e., the initial thickness is of layer 301' which is formed above and covering the exposed bump/solder ball pairs 390. In either case, in an embodiment, the passivation layer is formed by a dry lamination process. Referring again to FIG. 3B, $\delta_T$ represents total film thickness, $\delta_1$ represents target film thickness as a desired final passivation layer thickness, $\delta_2$ represents additional film thickness to be consumed as during plasma dicing and/or ashing, and $\delta_3$ represents the minimum film thickness needed to protect bumps from exposure during dicing.

Figure 3C:
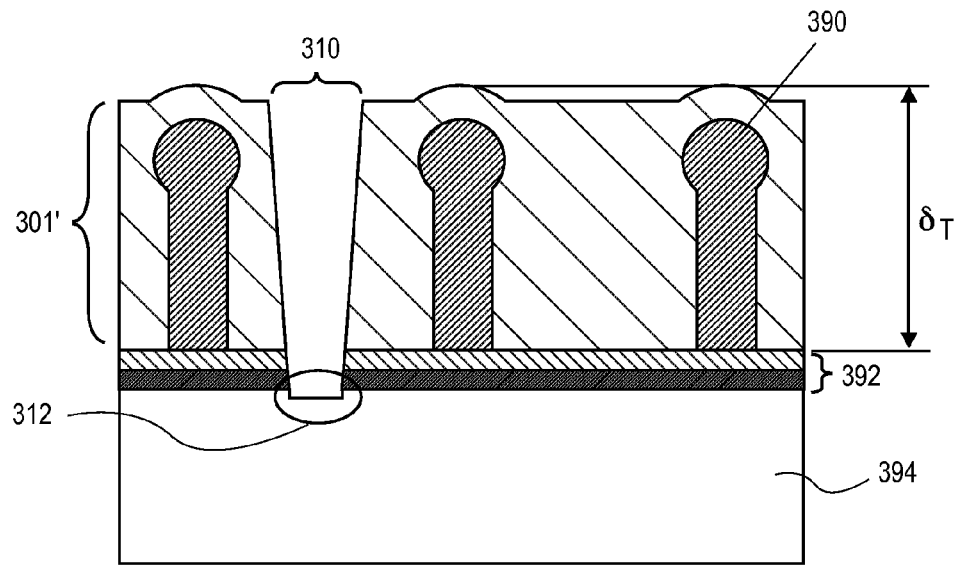

Referring to FIG. 3C, the passivation layer 301' is patterned with a laser scribing process to provide gaps 310. The laser scribing process is also used to scribe the device and passivation layers 392, exposing regions of the substrate 394 between the integrated circuits (i.e., between individual DRAM chips). The laser scribing process may be performed along streets (not shown here, but rather described in association with FIG. 6) formed in the device and passivation layers 392. In accordance with an embodiment of the present invention, the laser scribing process further forms trenches 312 partially into the regions of the substrate 394 between the integrated circuits, as depicted in FIG. 3C.

Figure 3D:
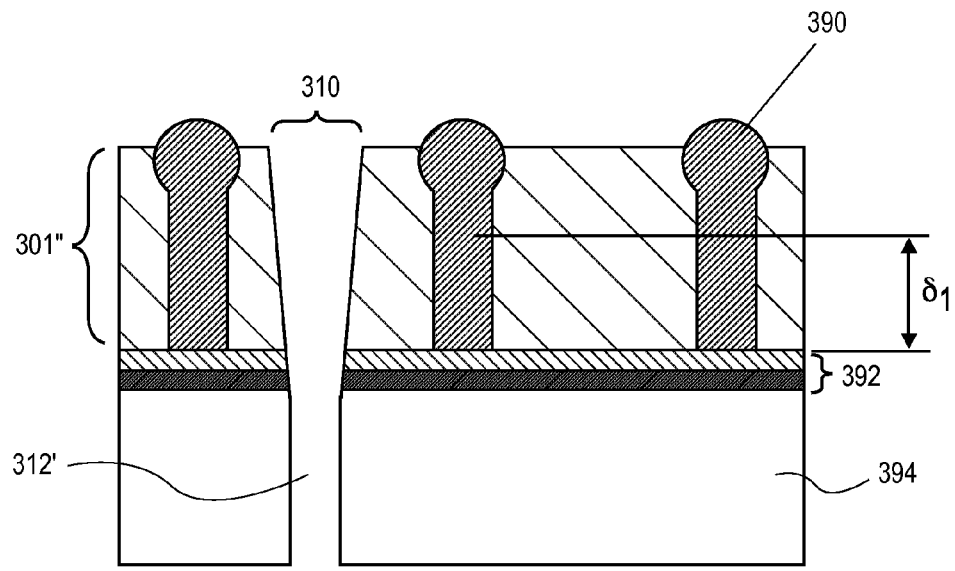

Referring now to FIG. 3D, the DRAM wafer 350 is etched through the scribe lines in the patterned passivation layer 301 to singulate the integrated circuits. In accordance with an embodiment of the present invention, etching the DRAM wafer 350 includes ultimately etching entirely through the DRAM wafer 350, as depicted in FIG. 3D. In one embodiment, the etching is along trenches 312 to extend and form complete trenches 312' through the substrate 394. Referring again to FIG. 3D, the plasma etching also recesses the passivation layer 301' to a reduced thickness 301". In one such embodiment, although recessed somewhat, the remaining polymer thickness 301" is still more than the target passivation layer thickness $\delta_1$.

Figure 3E:
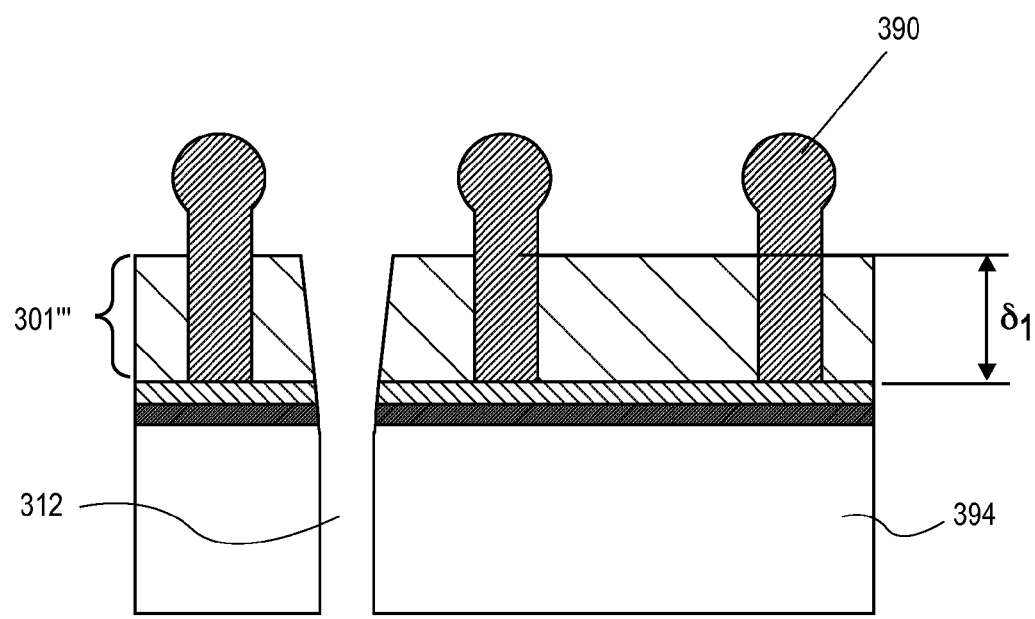

Referring to FIG. 3E, the passivation layer 301" is further thinned to a final passivation layer 301'" having the target value $\delta_1$. In one embodiment, the additional thinning is performed by using a plasma ash process. In a specific such embodiment, the plasma ash process involves ashing with $O_2$ to trim the polymer thickness. Following the plasma ashing process, additional processing may include wafer/die cleaning, die pack, die attach, soldering, etc.

To further distinguish the above process described in association with FIGS. 3A-3E as a maskless process, FIG. 4 illustrates a cross-sectional view of a semiconductor wafer including a plurality of integrated circuits during performing of a mask-utilizing method of dicing the semiconductor wafer. Referring to FIG. 4, a mask 302 is formed above the structure of FIG. 3A. The mask 302 is composed of a layer covering and protecting the exposed bump/solder ball pairs. Referring again to FIG. 4, the mask 302 is patterned with a laser scribing process to provide a patterned mask 308 with gaps 310. The laser scribe process is also used to scribe the passivation layer 301 along with device and passivation layers, exposing regions of the Si substrate between the integrated circuits (i.e., between individual DRAM chips). The laser scribing process may be performed along streets formed in the device and passivation layers (not shown). The laser scribing process may further forms trenches 312 partially into the regions of the Si wafer between the integrated circuits, as depicted in FIG. 4.

Referring again to FIGS. 3A-3E, in an embodiment, the DRAM wafer 350 is substantially composed of a material suitable to withstand a fabrication process and upon which semiconductor processing layers may suitably be disposed. For example, in one embodiment, semiconductor wafer or substrate is composed of a group IV-based material such as, but not limited to, crystalline silicon (as shown), germanium or silicon/germanium. In a specific embodiment, providing semiconductor wafer includes providing a monocrystalline silicon substrate. In a particular embodiment, the monocrystalline silicon substrate is doped with impurity atoms. In another embodiment, semiconductor wafer or substrate is composed of a material such as, e.g., a material substrate used in the fabrication of light emitting diodes (LEDs).

In an embodiment, the semiconductor wafer has disposed thereon or therein, as a portion of the integrated circuits (shown as DRAM integrated circuits), an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Materials making up the streets may be similar to or the same as those materials used to form the integrated circuits. For example, the streets may be composed of layers of dielectric materials, semiconductor materials, and metallization. In one embodiment, one or more of the streets includes test devices similar to the actual devices of the integrated circuits.

In an embodiment, patterning thick passivation layer 301' with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the passivation layer, the streets and, possibly, a portion of the Si wafer.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, as an exemplary material stack. Referring again to FIG. 6, a very thick passivation layer 620 (such as a greater than 50 micron thick polyimide layer, such as layer 301') is included, as described above. In accordance with an embodiment of the present invention, a mask layer distinct from the passivation layer 620 is not used during the dicing process. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 7 includes a plot 700 of absorption coefficient as a function of photon energy for crystalline silicon (c-Si, 702), copper (Cu, 704), crystalline silicon dioxide (c-SiO2, 706), and amorphous silicon dioxide (a-SiO2, 708), in accordance with an embodiment of the present invention. FIG. 8 is an equation 800 showing the relationship of laser intensity for a given laser as a function of laser pulse energy, laser pulse width, and laser beam radius.

Using equation 800 and the plot 700 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a thick polyimide layer, a street, and a portion of a silicon substrate.

By contrast, if non-optimal laser parameters are selected, in stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

The spacial beam profile at the work surfaces may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

In an embodiment, etching the semiconductor wafer includes using a plasma etching process. In one embodiment, a through-silicon via type etch process is used. For example, in a specific embodiment, the etch rate of the material of semiconductor wafer (e.g., silicon) is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the subsequent plasma ashing operation to further thin a thick passivation layer is performed in a plasma ash chamber suitable for performing an $O_2$ plasma ash process. In one such embodiment, the chamber is similar to the chamber described for the plasma etch process.

Accordingly, referring again to FIGS. 3A-3E, wafer dicing may be preformed by initial laser ablation through a mask layer, through wafer streets (including metallization), and partially into a silicon substrate. The laser pulse width may be selected in the femto-second range. Die singulation may then be completed by subsequent through-silicon deep plasma etching. A thick passivation layer of the integrated circuits may then be thinned to exposed portions of bumps/pillars. The singulation process may further include patterning a die attach film, exposing a top portion of a backing tape and singulating the die attach film. In an embodiment, the die attach film is singulated by a laser process or by an etch process. Further embodiments may include subsequently removing the singulated portions of substrate (e.g., as individual integrated circuits) from the backing tape. In one embodiment, the singulated die attach film is retained on the back sides of the singulated portions of substrate. In an embodiment, the singulated integrated circuits are removed from the backing tape for packaging. In one such embodiment, a patterned die attach film is retained on the backside of each integrated circuit and included in the final packaging. However, in another embodiment, the patterned die attach film is removed during or subsequent to the singulation process. In an alternative embodiment, in the case that the substrate is thinner than approximately 50 microns, the laser ablation process is used to completely singulate the substrate without the use of an additional plasma process.

A single process tool may be configured to perform many or all of the operations in a hybrid laser ablation and plasma etch singulation process. For example, FIG. 9 illustrates a block diagram of a tool layout for laser and plasma dicing of wafers or substrates, in accordance with an embodiment of the present invention.

Referring to FIG. 9, a process tool 900 includes a factory interface 902 (FI) having a plurality of load locks 904 coupled therewith. A cluster tool 906 is coupled with the factory interface 902. The cluster tool 906 includes one or more plasma etch chambers, such as plasma etch chamber 908. A laser scribe apparatus 910 is also coupled to the factory interface 902. The overall footprint of the process tool 900 may be, in one embodiment, approximately 3500 millimeters (3.5 meters) by approximately 3800 millimeters (3.8 meters), as depicted in FIG. 9.

In an embodiment, the laser scribe apparatus 910 houses a femto-second-based laser. The femtosecond-based laser is suitable for performing a laser ablation portion of a hybrid laser and etch singulation process, such as the laser abalation processes described above. In one embodiment, a moveable stage is also included in laser scribe apparatus 900, the moveable stage configured for moving a wafer or substrate (or a carrier thereof) relative to the femtosecond-based laser. In a specific embodiment, the femtosecond-based laser is also moveable. The overall footprint of the laser scribe apparatus 910 may be, in one embodiment, approximately 2240 millimeters by approximately 1270 millimeters, as depicted in FIG. 9. It is to be understood, however, in other embodiments, a nano- or pico-second based laser is used.

In an embodiment, the one or more plasma etch chambers 908 is configured for etching a wafer or substrate through the gaps in a patterned mask to singulate a plurality of integrated circuits. In one such embodiment, the one or more plasma etch chambers 908 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 908 to facilitate high silicon etch rates. In an embodiment, more than one etch chamber is included in the cluster tool 906 portion of process tool 900 to enable high manufacturing throughput of the singulation or dicing process. For example, in one such embodiment, as dedicated plasma ash chamber 912 is included, as depicted.

The factory interface 902 may be a suitable atmospheric port to interface between an outside manufacturing facility with laser scribe apparatus 910 and cluster tool 906. The factory interface 902 may include robots with arms or blades for transferring wafers (or carriers thereof) from storage units (such as front opening unified pods) into either cluster tool 906 or laser scribe apparatus 910, or both.

Cluster tool 906 may include other chambers suitable for performing functions in a method of singulation. For example, in one embodiment, in place of an additional etch chamber, a wet/dry station 914 is included. The wet/dry station may be suitable for cleaning residues and fragments subsequent to a laser scribe and plasma etch/ash singulation process of a substrate or wafer. In an embodiment, a metrology station is also included as a component of process tool 900.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 900 described in association with FIG. 9. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a front surface with a plurality of integrated circuits thereon and having a passivation layer disposed between and covering metal pillar/solder bump pairs of the integrated circuits. The method involves laser scribing, without the use of a mask layer, the passivation layer to provide scribe lines exposing the semiconductor wafer. The method also involves plasma etching the semiconductor wafer through the scribe lines to singulate the integrated circuits, wherein the passivation layer protects the integrated circuits during at least a portion of the plasma etching. The method also involves thinning the passivation layer to partially expose the metal pillar/solder bump pairs of the integrated circuits.

Thus, maskless hybrid laser scribing and plasma etching wafer dicing processes have been disclosed.

What is claimed is:

1. A method of dicing a silicon wafer comprising a front surface having a plurality of DRAM circuits thereon and having a polyimide layer disposed between and covering metal pillar/solder bump pairs of the DRAM circuits, the method comprising:

laser scribing, without the use of a mask layer, the polyimide layer to provide scribe lines exposing the silicon wafer, the laser scribing performed through a layer of low K material and a layer of copper both disposed between the polyimide layer and the silicon substrate, the laser scribing comprising a femto-second-based laser scribing process;

plasma etching the silicon wafer through the scribe lines to singulate the DRAM circuits, wherein the polyimide layer protects the DRAM circuits during at least a portion of the plasma etching; and plasma ashing the polyimide layer to thin the polyimide layer, partially exposing the metal pillar/solder bump pairs of the DRAM circuits.

2. The method of claim 1, wherein plasma ashing the polyimide layer comprises using a plasma ashing process based on $O_2$.

3. The method of claim 1, wherein plasma ashing the polyimide layer comprises thinning the polyimide layer to a final thickness approximately in the range of 35-50 microns.

4. The method of claim 1, wherein laser scribing the polyimide layer to provide scribe lines exposing the silicon wafer comprises forming trenches in the silicon wafer, and wherein plasma etching the silicon wafer through the scribe lines comprises plasma etching through the trenches.

5. The method of claim 1, wherein plasma etching the silicon wafer comprises using a high density plasma etching process.

6. The method of claim 1, wherein the femto-second-based laser scribing process comprises using a laser having a wavelength of approximately less than or equal to 540 nanometers with a laser pulse width of approximately less than or equal to 400 femto-seconds.

* * * * *